United States Patent
Ayai

(10) Patent No.: US 7,514,388 B2
(45) Date of Patent: Apr. 7, 2009

(54) METHOD OF PRODUCING A MATERIAL OF OXIDE SUPERCONDUCTOR, METHOD OF PRODUCING AN OXIDE SUPERCONDUCTING WIRE, AND SUPERCONDUCTING APPARATUS

(75) Inventor: Naoki Ayai, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 373 days.

(21) Appl. No.: 11/579,583

(22) PCT Filed: Jan. 30, 2006

(86) PCT No.: PCT/JP2006/001399

§ 371 (c)(1),
(2), (4) Date: Nov. 6, 2006

(87) PCT Pub. No.: WO2006/082767

PCT Pub. Date: Aug. 10, 2006

(65) Prior Publication Data

US 2008/0020936 A1    Jan. 24, 2008

(30) Foreign Application Priority Data

Feb. 2, 2005 (JP) .............................. 2005-026466
Dec. 26, 2005 (JP) .............................. 2005-372553

(51) Int. Cl.
*H01B 12/00* (2006.01)
*B05D 5/12* (2006.01)
*C04B 35/622* (2006.01)

(52) U.S. Cl. ..................... 505/425; 427/421.1; 239/13

(58) Field of Classification Search ............... 505/425; 423/592.1; 239/8–10, 13; 34/428; 427/421.1, 427/427

See application file for complete search history.

(56) References Cited

U.S. PATENT DOCUMENTS 5,079,217 A * 1/1992 Leary ...................... 505/500

(Continued)

FOREIGN PATENT DOCUMENTS

JP          1-179723 A      7/1989

(Continued)

OTHER PUBLICATIONS

M. Awano, et al.; "Enhancement for Synthesis of BI-PB-Sr-CA-Cu-O Superconductor by the Spray Drying and Subsequent Calcination with Rapid Heating"; Japanese Journal of Applied Physics, vol. 30, No. 5A, (1991), pp. L806-L808.

(Continued)

*Primary Examiner*—Mark Kopec
(74) *Attorney, Agent, or Firm*—Foley & Lardner LLP

(57) ABSTRACT

A method of producing a material of an oxide superconductor comprises the following steps: (a) in a solution, ionizing a material containing an atom for constituting the oxide superconductor, (b) by removing a solvent by spraying the solution in a first atmosphere, producing a material powder containing the atom for constituting the oxide superconductor, and (c) cooling the material powder in a second atmosphere into which a cooling gas is introduced. In this method, the concentration of carbon dioxide in the second atmosphere is lower than that in the first atmosphere, which contains the removed solvent component. The concentration of nitrogen oxide in the second atmosphere is lower than that in the first atmosphere, which contains the removed solvent component. The concentration of water vapor in the second atmosphere is lower than that in the first atmosphere, which contains the removed solvent component. These specifications enable the method to increase the density and purity of the oxide superconductor.

11 Claims, 5 Drawing Sheets

U.S. PATENT DOCUMENTS 5,081,102 A * 1/1992 Gay et al. ................... 505/510
5,304,666 A * 4/1994 McLain ....................... 556/21
5,505,865 A * 4/1996 Kumar et al. ............ 252/62.62

FOREIGN PATENT DOCUMENTS

| JP | 1-188415 A | 7/1989 |
|---|---|---|
| JP | 2003-203532 A | 7/2003 |
| JP | 2004-119248 | 4/2004 |
| WO | WO 03/100795 A1 | 4/2003 |

OTHER PUBLICATIONS

N. Toghe, et al.; "Preparation Conditions and Morphology of Superconducting Fine Particles in the Bi-Ca-Sr-Cu-O Systems Prepared by Spray Pyrolysis"; J.Am. Ceram. Soc., 74 (9), (1991), p. 2117-2122.

International Search Report of PCT/JP2006/301399.

* cited by examiner

METHOD OF PRODUCING A MATERIAL OF OXIDE SUPERCONDUCTOR, METHOD OF PRODUCING AN OXIDE SUPERCONDUCTING WIRE, AND SUPERCONDUCTING APPARATUS

TECHNICAL FIELD

The present invention relates to a method of producing a material of an oxide superconductor, a method of producing an oxide superconducting wire, and a superconducting apparatus, in particular, a method of producing a material of an oxide superconductor, the method being capable of increasing the density and purity of the oxide superconductor, a method of producing an oxide superconducting wire, and a superconducting apparatus.

BACKGROUND ART

Oxide superconducting wires are produced by the following process:

(a) a metal tube is filled with a material (material powder) of an oxide superconductor;
(b) the metal tube is processed by drawing or rolling to obtain a wire having an intended shape;
(c) the obtained wire is heat-treated to sinter the material of the oxide superconductor; and
(d) thus, an oxide superconductor is produced.

A material of an oxide superconductor has been produced by the following method, for example: First, powders of raw materials of an oxide or carbonate of elements for constituting the oxide superconductor are mixed with a specified ratio. Next, the mixed powder is treated a plurality of times with a heat treatment at 700 to 860° C. or so and with pulverization. Thus, the material of the oxide superconductor is obtained that is composed of a superconducting phase and a non-superconducting phase. Such a method of producing a material of an oxide superconductor has been disclosed in the published Japanese patent application Tokukai 2004-119248 (Patent literature 1), for example.

However, the above-described production method has a problem in that the heat treatment and pulverization are required to perform a plurality of times in order to make the material powder uniform. In addition, even the heat treatment and pulverization are performed a plurality of times, the uniformity of the material powder has a limitation.

In view of the above-described situation, for example, non-patent literatures 1 and 2 have disclosed a production method that can easily produce a material of an oxide superconductor that has uniformly distributed elements constituting the oxide superconductor. In the production methods disclosed in non-patent literatures 1 and 2, first, the elements for constituting the oxide superconductor are dissolved in a nitric acid solution to ionize the elements. Next, the nitrate solution is sprayed in a high-temperature atmosphere to remove the solvent so that a powder can be obtained. Then, the temperature of the atmosphere is reduced to cool the powder. Thus, the material powder comprising the elements for constituting the oxide superconductor is produced.

Patent literature 1: the published Japanese patent application Tokukai 2004-119248.
Non-patent literature 1: M. Awano, et al., "Enhancement for Synthesis of Bi—Pb—Sr—Ca—Cu—O superconductor by the Spray Drying and Subsequent Calcination with Rapid Heating," Japanese Journal of Applied Physics, Vol. 30, No. 5A, (1991), pp. L806-L808.
Non-patent literature 2: N. Tohge, et al., "Preparation Conditions and Morphology of Superconducting Fine Particles in the Bi—Ca—Sr—Cu—O System Prepared by Spray Pyrolysis," J. Am. Ceram. Soc., 74 (9), (1991), pp. 2117-2122.

DISCLOSURE OF THE INVENTION

Problem to be Solved

However, conventional oxide superconducting wires have a problem in that the oxide superconductor has low density and low purity. The low density and low purity of the oxide superconductor create a problem of a reduction in superconducting property such as a critical current value, for example.

In view of the above-described situation, an object of the present invention is to offer a method of producing a material of an oxide superconductor, the method being capable of increasing the density and purity of the oxide superconductor and a method of producing an oxide superconducting wire.

Means to Solve the Problem

The present inventor found that the problem of low density and low purity of the oxide superconductor in an oxide superconducting wire is attributable to the fact that the material of the oxide superconductor contains a large amount of residues such as carbon, nitrogen, and water. When the material of the oxide superconductor contains a large amount of these residues, the purity of the oxide superconductor is decreased. Consequently, at the time of the heat treatment to produce an oxide superconductor in the production process of the oxide superconducting wire, the carbon is released as carbon dioxide and the nitrogen and water are released in the form of gas. As a result, voids are formed in the oxide superconductor, decreasing the density of the oxide superconductor.

The present inventor also found that the residues contained in the material of the oxide superconductor are left behind at the time of the production of the material of the oxide superconductor. In particular, after the removal of the solvent, when the powder is cooled, carbon dioxide, nitrogen oxide, and water vapor contained in the cooling atmosphere are adsorbed to the powder as the residues. In conventional methods of producing the material of an oxide superconductor, the atmosphere containing the components of the removed solvent is used without being treated as the cooling atmosphere to cool the powder. The components of the removed solvent are contained in the atmosphere as carbon dioxide, nitrogen oxide, water vapor, and the like. These gases adhere to the powder at the time of the cooling to form the residues.

In view of the above-described circumstances, according to the present invention, a method of producing a material of an oxide superconductor comprises the following steps:
(a) in a solution, ionizing a material containing an atom for constituting the oxide superconductor;
(b) by removing a solvent by spraying the solution in a first atmosphere, producing a powder containing the atom for constituting the oxide superconductor; and
(c) cooling the powder in a second atmosphere into which a cooling gas is introduced.

In this method, the concentration of carbon dioxide in the second atmosphere is lower than that in the first atmosphere, which contains the removed solvent component. In addition, the concentration of nitrogen oxide in the second atmosphere is lower than that in the first atmosphere, which contains the removed solvent component. Furthermore, the concentration of water vapor in the second atmosphere is lower than that in the first atmosphere, which contains the removed solvent component.

According to the present invention, in a method of producing the material of an oxide superconductor, the second atmosphere is an atmosphere that is produced by diluting with the cooling gas the concentrations of the carbon dioxide, nitrogen oxide, and water vapor of the first atmosphere, which contains the solvent components. The second atmosphere is used to cool the powder. Therefore, in comparison with conventional methods, the carbon dioxide, nitrogen oxide, and water vapor reduce the amounts of adhesion to the powder when it is cooled. In other words, the present invention can reduce the residual carbon, nitrogen, and water contained in the oxide superconductor. As a result, the density and purity of the oxide superconductor can be increased.

In the above description, the "first atmosphere" means an atmosphere that contains the solvent removed by the spraying of the solution, and the "second atmosphere" means an atmosphere that is constituted by mixing a cooling gas with the first atmosphere.

According to the present invention, in a method of producing the material of an oxide superconductor, it is desirable that the step of producing a powder comprise the following steps:
(b1) spraying the solution together with a spraying gas, and
(b2) carrying the solution from the first atmosphere to the second atmosphere by using a carrier gas.

In addition to the above description, it is desirable that the volume flow rate of the entire gas formed by adding the spraying gas, the carrier gas, and the cooling gas be at least 10,000 times that of the solution.

According to the present invention, in a method of producing the material of an oxide superconductor, it is desirable that the step of producing a powder comprise the following steps:
(b1) spraying the solution together with a spraying gas, and
(b2) carrying the solution from the first atmosphere to the second atmosphere by using a carrier gas
(b1) spraying the solution together with a spraying gas, and
(b2) carrying the solution from the first atmosphere to the second atmosphere by using a carrier gas.

In addition to the above description, it is desirable that the concentration of the water vapor in the second atmosphere be at most 10 vol. %.

The use of the spraying gas enables the easy spraying of the solution. The use of the carrier gas enables the easy carrying of the powder to the second atmosphere. The above-described specification of the volume flow rate of the entire gas and the concentration of water vapor in the second atmosphere enables an increase in critical current value.

According to the present invention, in a method of producing the material of an oxide superconductor, it is desirable that the step of producing a powder comprise the following steps:
(b1) spraying the solution together with a spraying gas, and
(b2) carrying the solution from the first atmosphere to the second atmosphere by using a carrier gas.

In addition to the above description, it is desirable that the relationship $0.1\ (sec) \leq V/(q_1+q_2) \leq 20\ (sec)$ be satisfied,
where $q_1$ (liter/sec) is the volume flow rate of the first atmosphere's gas formed by adding the spraying gas and the carrier gas,
$q_2$ (liter/sec) is the volume flow rate of the gas generated from the solution, and
V (liter) is the volume of the first atmosphere.

In the above description, the term $V/(q_1+q_2)$ means a time period during which the solution stays in the first atmosphere. When the staying time period is set to be shorter than 20 (sec), the volume flow rate $(q_1+q_2)$ of the total of the spraying gas and carrier gas can be increased, sufficiently decreasing the concentration of the water vapor in the first atmosphere. On the other hand, when the staying time period is set to be longer than 0.1 (sec), the volume flow rate of the total of the spraying gas and carrier gas is not increased excessively. Therefore, the time period during which the material (solution) stays in the heating zone does not become excessively short and the pyrolytic reaction becomes sufficient. Consequently, the specification of the above-described range can further increase the critical-current value.

According to the present invention, in a method of producing the material of an oxide superconductor, it is desirable that the step of producing a powder comprise the following steps:
(b1) spraying the solution together with a spraying gas, and
(b2) carrying the solution from the first atmosphere to the second atmosphere by using a carrier gas.

In addition to the above description, it is desirable that each of the spraying gas, the carrier gas, and the cooling gas have a water-vapor concentration of at most 1 vol. %.

When each of the spraying gas, the carrier gas, and the cooling gas is set to have a water-vapor concentration of at most 1 vol. %, the critical current value can be increased. In view of the reduction in water contained in the powder, it is desirable to reduce the concentration of the water vapor to the least possible amount.

According to the present invention, in a method of producing the material of an oxide superconductor, it is desirable that the step of producing a powder comprise the following steps:
(b1) spraying the solution together with a spraying gas, and
(b2) carrying the solution from the first atmosphere to the second atmosphere by using a carrier gas.

In addition to the above description, it is desirable that each of the spraying gas, the carrier gas, and the cooling gas have a carbon dioxide concentration of at most 30 vol. ppm.

When each of the spraying gas, the carrier gas, and the cooling gas is set to have a carbon dioxide concentration of at most 30 vol. ppm, the critical current value can be increased. In this case, at the time of the removing of the solvent, carbon dioxide is usually generated from the solvent. Furthermore, the atmosphere usually contains carbon dioxide. Therefore, it is difficult to reduce the carbon dioxide concentration to zero. As a result, the above-specified carbon dioxide concentration is larger than zero.

According to the present invention, in a method of producing the material of an oxide superconductor, it is desirable that the method further comprise a step of heat-treating the powder after the step of cooling the powder.

The step of heat-treating removes the residues such as carbon, nitrogen, and water contained in the material of the oxide superconductor as gases. As a result, the residues contained in the material of the oxide superconductor can be further reduced.

According to the present invention, in a method of producing the material of an oxide superconductor, it is desirable that (a) a step be further provided in which the powder is cooled immediately after the heat treatment of it, (b) both the step of heat-treating the powder and the step of cooling the powder immediately after the heat treatment of it be carried out in a heat-treating apparatus, and (c) the concentration of water vapor be at most 1 vol. % in each of the following atmospheres:
(c1) the atmosphere in the heat-treating apparatus at the time of the introduction of the powder into the heat-treating apparatus;
(c2) the atmosphere in the heat-treating apparatus at the time of the heat treatment of the powder;

(c3) the atmosphere in the heat-treating apparatus at the time of the cooling of the powder; and (c4) the atmosphere in the heat-treating apparatus at the time of the taking out of the powder from the heat-treating apparatus.

The present inventor found that in the step of heat-treating the powder, even at the time of the introduction of the powder into the heat-treating apparatus, at the time of the heat treatment of the powder, at the time of the cooling of the powder, and at the time of the taking out of the powder from the heat-treating apparatus, carbon dioxide, nitrogen, and water vapor contained in the cooling atmosphere are adsorbed to the powder to remain on the powder as the residues. Subsequently, the present inventor found that when these operations are performed in an atmosphere having a water-vapor concentration of at most 1 vol. %, the adsorption of the water vapor onto the powder at the time of the cooling can be suppressed, further decreasing the residues contained in the material of the oxide superconductor. In this case, it is desirable to reduce the concentration of the water vapor to the least possible amount.

According to the present invention, in a method of producing the material of an oxide superconductor, it is desirable that (a) a step be further provided in which the powder is cooled immediately after the heat treatment of it, (b) both the step of heat-treating the powder and the step of cooling the powder immediately after the heat treatment of it be carried out in a heat-treating apparatus and (c) the concentration of carbon dioxide be at most 30 vol. ppm in each of the following atmospheres:

(c1) the atmosphere in the heat-treating apparatus at the time of the introduction of the powder into the heat-treating apparatus;

(c2) the atmosphere in the heat-treating apparatus at the time of the heat treatment of the powder;

(c3) the atmosphere in the heat-treating apparatus at the time of the cooling of the powder; and (c4) the atmosphere in the heat-treating apparatus at the time of the taking out of the powder from the heat-treating apparatus.

The present inventor found that in the step of heat-treating the powder, even at the time of the introduction of the powder into the heat-treating apparatus, at the time of the heat treatment of the powder, at the time of the cooling of the powder, and at the time of the taking out of the powder from the heat-treating apparatus, carbon dioxide, nitrogen, and water vapor contained in the cooling atmosphere are adsorbed to the powder to remain on the powder as the residues. Subsequently, the present inventor found that when these operations are performed in an atmosphere having a carbon dioxide concentration of at most 30 vol. ppm, the adsorption of the carbon dioxide onto the powder at the time of the cooling can be suppressed, further decreasing the residues contained in the material of the oxide superconductor. In this case, at the time of the heat treatment of the powder, carbon dioxide is usually generated from the powder. Furthermore, the atmosphere usually contains carbon dioxide. Therefore, it is difficult to reduce the carbon dioxide concentration to zero.

According to the present invention, in a method of producing the material of an oxide superconductor, it is desirable that the solution for ionizing a material containing an atom for constituting the oxide superconductor be a nitric acid solution. The use of the nitric acid enables sufficient dissolution.

According to the present invention, a method of producing an oxide superconducting wire comprises the following steps:

(a) producing a material of an oxide superconductor by using the above-described method of producing a material of an oxide superconductor; and (b) producing an oxide superconducting wire by using the material of the oxide superconductor.

This specification enables an increase in the density and purity of the oxide superconductor.

According to the present invention, an oxide superconducting apparatus incorporates an oxide superconducting wire produced by using the above-described method of producing an oxide superconducting wire.

The above specification enables the production of an oxide superconducting apparatus capable of increasing the density and purity.

EFFECT OF THE INVENTION

According to the present invention, a method of producing a material of an oxide superconductor and a method of producing an oxide superconducting wire can increase the density and purity of the oxide superconductor.

Figure 1:
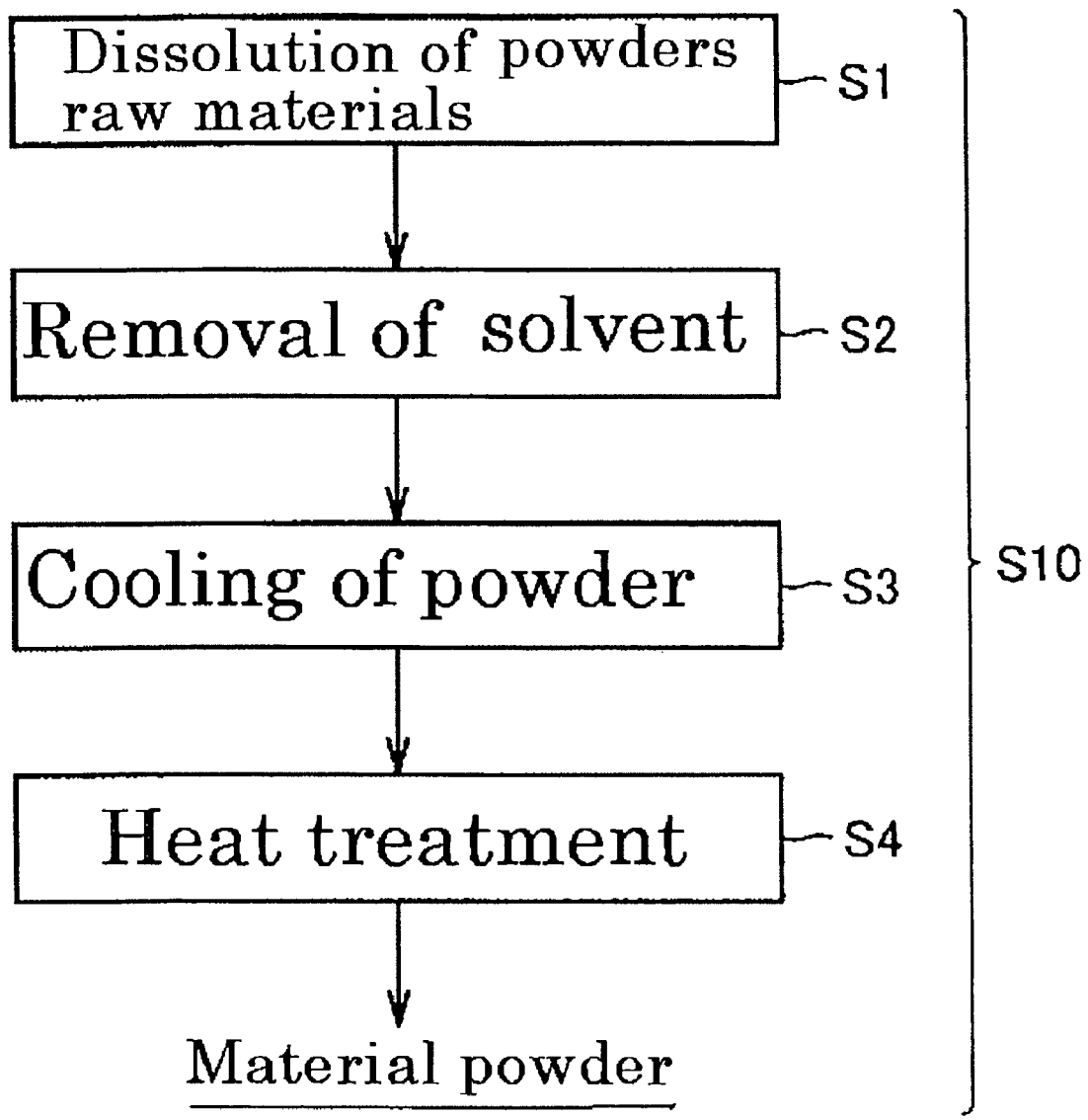
FIG. 1 is a process chart showing a method of producing the material of an oxide superconductor in Embodiment 1 of the present invention.

EXPLANATION OF THE SIGN 1, 1a: material powder, 2: oxide superconductor, 3: sheath portion, 4: oxide superconducting wire, 11: solution, 12: spray, 13: electric furnace, 14 to 16: atmosphere, 17: powder collector, 17a: container, 18: filter, 21: injecting orifice, 22: cooling-gas-introducing inlet, 23: outlet, 30: heat-treating apparatus, 31: heat-treating chamber, 32: cooling chamber, 33: heater, 34a: introducing pathway, 34b: connecting pathway, 34c: taking-out pathway.

BEST MODE FOR CARRYING OUT THE INVENTION

Embodiments of the present invention are explained below by referring to the drawing. The dimensional ratios in the drawing are not necessarily coincide with those of the explanation.

EMBODIMENT 1

In this embodiment, a method of producing the material of a bismuth-based oxide superconductor is explained.

Figure 2:
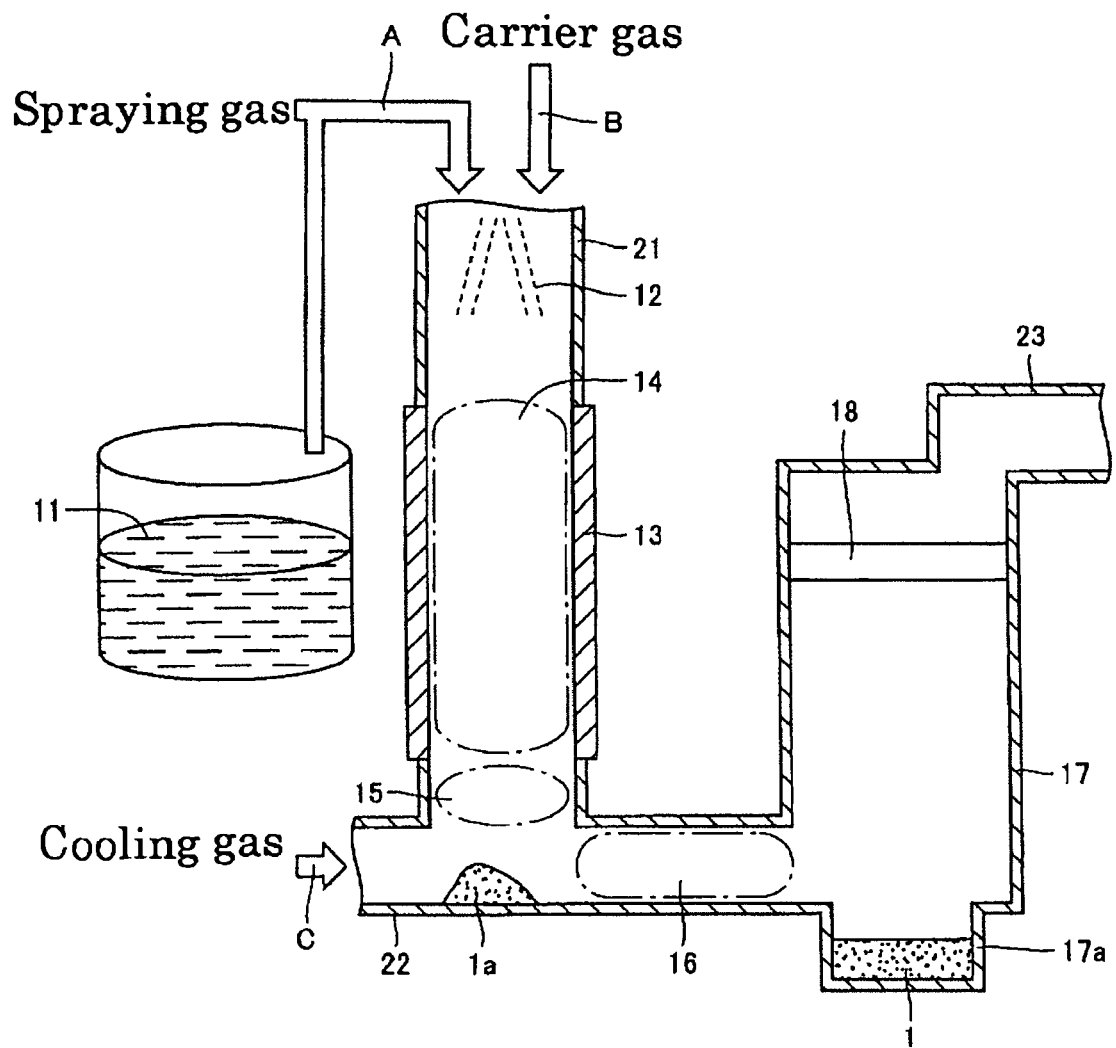
FIG. 2 is a diagram for explaining the method of producing the material of an oxide superconductor in Embodiment 1 of the present invention.

FIG. 1 is a process chart showing a method of producing the material of an oxide superconductor in Embodiment 1 of the present invention. FIG. 2 is a diagram for explaining the method of producing the material of an oxide superconductor in Embodiment 1 of the present invention.

As shown in FIGS. 1 and 2, first, a material containing atoms for constituting the oxide superconductor is ionized in a solution. More specifically, for example, powders of raw materials of $Bi_2O_3$, PbO, $SrCO_3$, $CaCO_3$, and CuO are dissolved in a nitric aid solution (Step S1). When dissolved, Bi (bismuth), Pb (lead), Sr (strontium), Ca (calcium), and Cu (copper) are ionized in the nitric aid solution. In addition, when the powders of the raw materials are dissolved, carbon dioxide is produced, enabling the removal of carbon components from the powders of the raw materials. It is desirable that each of the powders of the raw materials contain the least possible amount of the carbon component. A nitrate solution in which the powders of the raw materials are dissolved is a solution 11 (see FIG. 2).

The solution for dissolving components such as bismuth is not limited to nitric acid. Sulfuric acid, hydrochloric acid, and other inorganic acid may be used. Furthermore, not only an acid but also an alkaline solution may be used providing that it has a component capable of dissolving the material.

The temperature of the solution is not particularly limited. The temperature needs only to be a temperature capable of dissolving bismuth and the like sufficiently. To achieve sufficient solubility, the solution may be agitated with a agitating blade.

Next, by removing the solvent by spraying the solution 11 in an atmosphere 14, a material powder 1*a* is produced that contains the atom for constituting the oxide superconductor (Step S2). The production method is more specifically explained below.

The solution 11 is sprayed from an injecting orifice 21 together with a spraying gas. An arrow "A" shows the injection of the solution 11 and the spraying gas. Thus, a spray 12 is formed. On the other hand, a carrier gas is introduced from the injecting orifice 21 in a direction shown by an arrow "B." The carrier gas carries the spray 12 to an electric furnace 13. In the electric furnace 13, the solvent of the solution 11 included in the spray 12 is heated to evaporate. As described above, the solution is injected into an atmosphere 14 (first atmosphere), which is high-temperature and composed of the spraying gas and the carrier gas. At this moment, the solvent is removed. As a result, the material powder 1*a* is obtained that contains the atom for constituting the oxide superconductor. An atmosphere 15 at the exit of the electric furnace 13 contains the component of the removed solvent.

As the method for the injection, not only is the method employed in which the solution 11 is straightforwardly injected into the electric furnace 13 but also another method may be employed in which the solution 11 is injected such that vortex flow can be produced in the electric furnace 13. More specifically, the spray 12 may be formed such that horizontal vortexes or vertical vortexes are produced in the electric furnace 13. Furthermore, a spiral-shaped groove may be provided on the inside wall of the electric furnace 13 to form vortexes by supplying the spray 12 along the groove.

The temperature of the electric furnace 13 is not particularly limited. When nitrates are thermally decomposed in the electric furnace 13, the temperature of the electric furnace 13 may be set in the range of at least 700° C. and at most 850° C., for example. In addition, the length of the region in which the temperature is in the range of at least 700° C. and at most 850° C. in the electric furnace 13 may be predetermined to be 300 mm, for example.

The reaction in the electric furnace 13 varies to spray pyrolysis or to spray drying according to the temperature of the electric furnace 13. In the case of the spray pyrolysis, the temperature of the electric furnace 13 is at least about 700° C. and at most 850° C. In the spray pyrolysis, water is evaporated from the particles (spray 12) of the composite metal nitrate solution of Bi, Pb, Sr, Ca, and Cu, which constitute the solution. After the water evaporation, both the pyrolytic reaction of the nitrates and the reaction between metallic oxides succeeding the pyrolytic reaction are created instantaneously. In the case of the spray pyrolysis, the reaction takes place instantaneously. Therefore, it is difficult to control the chemical reaction precisely.

On the other hand, when the temperature of the electric furnace 13 is changed to at least 200° C. and at most 300° C., spray drying is performed. In the spray drying, while the water is evaporated which is the solvent component, all the nitric acid component remains. The nitric acid component can be removed by performing heat treatment afterward.

Subsequently, the powder is cooled by an atmosphere 16 into which a cooling gas is introduced (Step S3). More specifically, the cooling gas is introduced from a cooling-gas-introducing inlet 22 in a direction shown by an arrow "C." The cooling gas is mixed with the atmosphere 15 to constitute an atmosphere 16 (second atmosphere). While being cooled by the atmosphere 16, the material powder 1*a* is carried to a powder collector 17 by the carrier gas.

In this embodiment, the concentration of the carbon dioxide in the atmosphere 16 is lower than that in the atmosphere 15, the concentration of the nitrogen oxide in the atmosphere 16 is lower than that in the atmosphere 15, and the concentration of the water vapor in the atmosphere 16 is lower than that in the atmosphere 15. Therefore, when the material powder 1*a* is cooled in the atmosphere 16, the carbon dioxide, nitrogen, and water reduce their tendency to adhere to the powder.

Finally, the material powder 1*a* is cooled and housed in a container 17*a* placed at the bottom of the powder collector 17. Thus, a material powder 1 is obtained. The powder collector 17 is provided with an outlet 23 connected to a vacuum pump (not shown). After the material powder 1 is housed in the container 17*a*, the spraying gas, carrier gas, cooling gas, and removed solvent components are discharged from the outlet 23 through a filter 18.

As the spraying gas in this embodiment, dried air, nitrogen, and the like may be used. As the carrier gas, dried air and the like may be used. The spraying gas and carrier gas may either be a different gas or be the same type of gas. The flow-rate ratio between the spraying gas and carrier gas may be varied as required. As the cooling gas, a gas is used that can reduce the concentration of the carbon dioxide, nitrogen, and water vapor from that in the atmosphere 15 and that is lower in temperature than the atmosphere 15.

It is desirable that the volume flow rate of the entire gas formed by adding the spraying gas, carrier gas, and cooling gas be at least 10,000 times that of the solution 11. It is also desirable that the concentration of the water vapor in the atmosphere 16 be at most 10 vol. %. It is desirable that the following relationship be satisfied:

$$0.1 \text{ (sec)} \leq V/(q_1+q_2) \leq 20 \text{ (sec)},$$

where $q_1$ (liter/sec) is the volume flow rate of the atmosphere 14's gas formed by adding the spraying gas and carrier gas, $q_2$ (liter/sec) is the volume flow rate of the gas generated from the solution 11, V (liter) is the volume of the atmosphere 14, and $V/(q_1+q_2)$ means a time period (sec) during which the solution 11 stays in the atmosphere 14.

In addition, it is desirable that each of the spraying gas, carrier gas, and cooling gas have a water-vapor concentration of at most 1 vol. %. Furthermore, it is desirable that each of the spraying gas, carrier gas, and cooling gas have a carbon dioxide concentration of at most 30 vol. ppm. It is more desirable to combine a plurality of the above-described desirable conditions, because this combination further increases effects such as an increase in critical current value.

Subsequently, after being cooled, the material powder 1 is heat-treated in a heat-treating apparatus (Step S4). This heat treatment can further reduce the residues contained in the material powder 1. More specifically, the heat treatment is conducted through the method described below.

Figure 3:
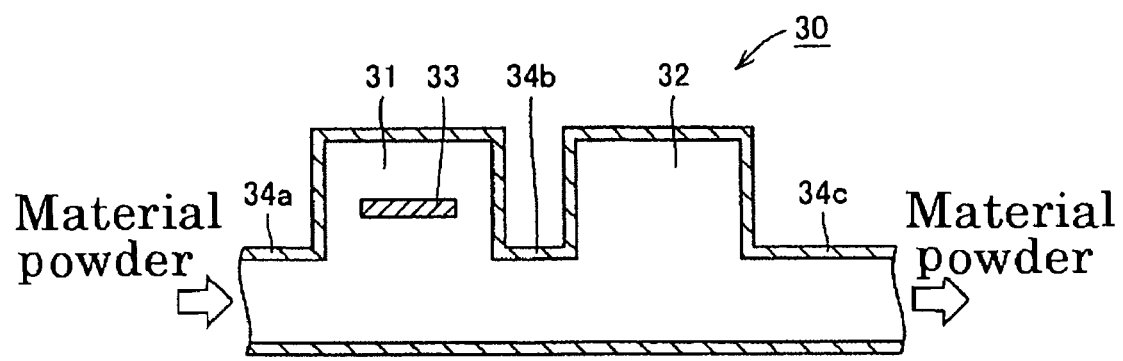
FIG. 3 is a diagram schematically showing the structure of the heat-treating apparatus in Embodiment 1 of the present invention.

FIG. 3 is a diagram schematically showing the structure of the heat-treating apparatus in Embodiment 1 of the present invention. As can be seen from FIG. 3, a heat-treating apparatus 30 comprises a heat-treating chamber 31 and a cooling chamber 32. The heat-treating chamber 31 is connected to an introducing pathway 34a, the heat-treating chamber 31 and the cooling chamber 32 are connected with each other through a connecting pathway 34b, and the cooling chamber 32 is connected to a taking-out pathway 34c. The heat-treating chamber 31 is provided with a heater 33. Both the heat treatment of the material powder 1 and the cooling of it immediately after the heat treatment are carried out in the heat-treating apparatus 30.

In FIG. 3, the atmosphere in the heat-treating chamber 30 at the time of the introduction of the material powder 1 into the heat-treating chamber 30 is the atmosphere in the introducing pathway 34a. The atmosphere in the heat-treating chamber 30 at the time of the heat treatment of the material powder 1 is the atmosphere in the heat-treating chamber 31. The atmosphere in the heat-treating chamber 30 at the time of the cooling of the material powder 1 is the atmosphere in the cooling chamber 32. The atmosphere in the heat-treating chamber 30 at the time of the taking out of the material powder 1 from the heat-treating chamber 30 is the atmosphere in the taking-out pathway 34c.

In this embodiment, it is desirable that each of the introducing pathway 34a, the heat-treating chamber 31, the connecting pathway 34b, the cooling chamber 32, and the taking-out pathway 34c have a water-vapor concentration of at most 1 vol. % and a carbon dioxide concentration of at most 30 vol. ppm. It is more desirable to combine the above-described desirable conditions, because this combination further increases effects such as the further reducing of the residues contained in the material powder 1 of the oxide superconductor.

The material powder 1 is carried to the heat-treating chamber 31 through the introducing pathway 34a. Then, the material powder 1 is heat-treated in the heat-treating chamber 31 by using the heater 33. The heat treatment is performed, for example, for 5 to 10 hours at a temperature of 750 to 850° C. in an atmosphere having an oxygen partial pressure of 0.05 to 0.1 MPa. Subsequently, the material powder 1 is carried to the cooling chamber 32 through the connecting pathway 34b. Then, the material powder 1 is cooled down to room temperature in the cooling chamber 32. Finally, the material powder 1 is taken out to the outside through the taking-out pathway 34c.

The above-described process can produce the material powder 1 as the material of an oxide superconductor. In this embodiment, the case is explained in which the material powder 1 is subjected to heat treatment (Step S4). Nevertheless, providing that the material powder 1 housed in the container 17a has an intended composition, the heat treatment may be omitted.

According to a method of producing the material powder 1 of an oxide superconductor in this embodiment, the atmosphere 16 is an atmosphere that is produced by diluting the concentrations of the carbon dioxide, nitrogen oxide, and water vapor of the atmosphere 15 with the cooling gas. The atmosphere 16 is used to cool the material powder 1. Therefore, in comparison with conventional methods, the carbon dioxide, nitrogen oxide, and water vapor reduce the amounts of adhesion to the material powder 1 when it is cooled. In other words, this embodiment can reduce the residual carbon, nitrogen, and water contained in the oxide superconductor. As a result, the density and purity of the oxide superconductor can be increased.

In this case, when the flow rate of the carrier gas is simply increased, the concentrations of the carbon dioxide, nitrogen oxide, and water vapor can be decreased. However, when the flow rate of the carrier gas is large, the time period is shortened during which the solution 11 passes through the electric furnace 13, creating a problem of insufficient removal of the solvent. In this respect, also, the present invention has an advantageous effect.

In the above-described production method, it is desirable that the step of producing the material powder 1a comprise the steps of:

(a) spraying the solution 11 together with a spraying gas; and (b) carrying the solution 11 from the atmosphere 15 to the atmosphere 16 by using a carrier gas.

It is desirable that the volume flow rate of the entire gas formed by adding the spraying gas, the carrier gas, and the cooling gas be at least 10,000 times that of the solution. It is also desirable that the concentration of the water vapor in the atmosphere 16 be at most 10 vol. %.

The use of the spraying gas enables easy spraying of the solution 11. The use of the carrier gas enables easy carrying of the material powder 1a to the atmosphere 16. The above-described specification of the volume flow rate of the entire gas and the concentration of the water vapor in the atmosphere 16 can increase the critical current value.

In addition, it is desirable that the relationship 0.1 (sec) $\leq V/(q_1+q_2) \leq 20$ (sec) be satisfied, where $q_1$ (liter/sec) is the volume flow rate of the atmosphere 14's gas formed by adding the spraying gas and the carrier gas, $q_2$ (liter/sec) is the volume flow rate of the gas generated from the solution 11, and V (liter) is the volume of the atmosphere 14.

When the time period during which the solution 11 stays in the atmosphere 14 is set to be shorter than 20 second, the concentration of the water vapor in the atmosphere 14 can be sufficiently reduced. When the time period during which the solution 11 stays in the atmosphere 14 is set to be longer than 0.1 second, the time period during which the solution 11 stays in the heating zone does not become excessively short and the pyrolytic reaction becomes sufficient. Consequently, the specification of the above-described range can increase the critical current value.

In addition, it is desirable that each of the spraying gas, carrier gas, and cooling gas have a water-vapor concentration of at most 1 vol. %. Furthermore, it is desirable that each of the spraying gas, carrier gas, and cooling gas have a carbon dioxide concentration of at most 30 vol. ppm.

The concentration of water vapor is at most 1 vol. % in each of the spraying gas, carrier gas, and cooling gas. In addition, the concentration of carbon dioxide is at most 30 vol. ppm in each of them. The above-described conditions can increase the critical current value.

In the above-described production method, a step of heat-treating the material powder 1 is provided after the step of cooling the material powder 1.

The step of heat-treating removes the residues such as carbon, nitrogen, and water contained in the material powder 1 of the oxide superconductor as gases. As a result, the residues contained in the material powder 1 of the oxide superconductor can be further reduced.

In the above-described production method, it is desirable that both the step of heat-treating the material powder 1 and the step of cooling immediately after the material powder 1 is heat-treated be carried out in the heat-treating apparatus 30. It is also desirable that at the time of heat-treating the material powder 1, the concentration of water vapor be at most 1 vol. % in each of the following atmospheres:

(a) the atmosphere in the introducing pathway 34a,
(b) the atmosphere in the heat-treating chamber 31,
(c) the atmosphere in the connecting pathway 34b,
(d) the atmosphere in the cooling chamber 32, and
(e) the atmosphere in the taking-out pathway 34c.

It is also desirable that the concentration of carbon dioxide be at most 30 vol. ppm in each of the above-described atmospheres.

The above specification can suppress the water vapor and carbon dioxide from being adsorbed to the material powder 1 at the time of the cooling, further reducing the residues contained in the material powder 1 of the oxide superconductor.

In the above-described production method, it is desirable that the solution for dissolving the powder of the raw material be a nitric acid solution. The use of nitric acid enables complete dissolution without forming a passive state. Furthermore, the carbon content can be reduced to zero in theory.

EMBODIMENT 2

In this embodiment, a method of producing an oxide superconducting wire is explained, the method using the material of the oxide superconductor produced in Embodiment 1.

Figure 4:
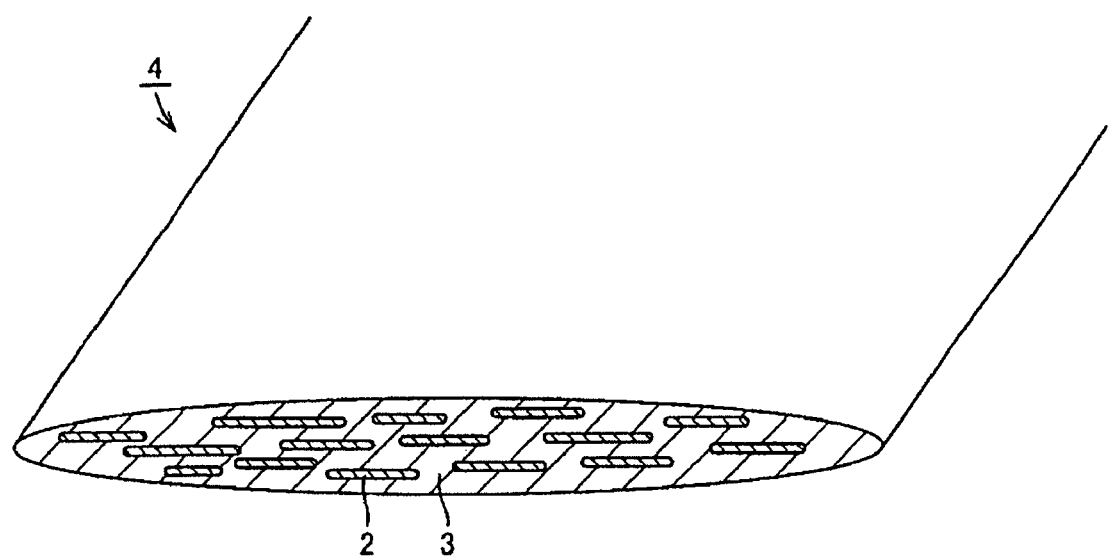
FIG. 4 is a partial cross-sectional perspective view schematically showing the structure of an oxide superconducting wire.

FIG. 4 is a partial cross-sectional perspective view schematically showing the structure of an oxide superconducting wire. By referring to FIG. 4, as an example, a multifilament oxide superconducting wire is explained below. An oxide superconducting wire 4 comprises a plurality of longitudinally extending oxide superconductors (filaments) 2 and a sheath portion 3 covering them. It is desirable that the material of each of the oxide superconductors have a Bi—Pb—Sr—Ca—Cu—O-based structure, for example. In particular, a material is most suitable that contains a Bi2223 phase, which approximately expresses the ratios of the atoms of bismuth and lead to strontium to calcium to copper as 2:2:2:3. The material of the sheath portion 3 is composed of, for example, metal such as silver or a silver alloy.

In the above, a multifilament wire is explained. Nevertheless, an oxide superconducting wire having a structure of a single-filament wire may be used in which a single oxide superconductor 2 is covered with a sheath portion 3.

Figure 5:
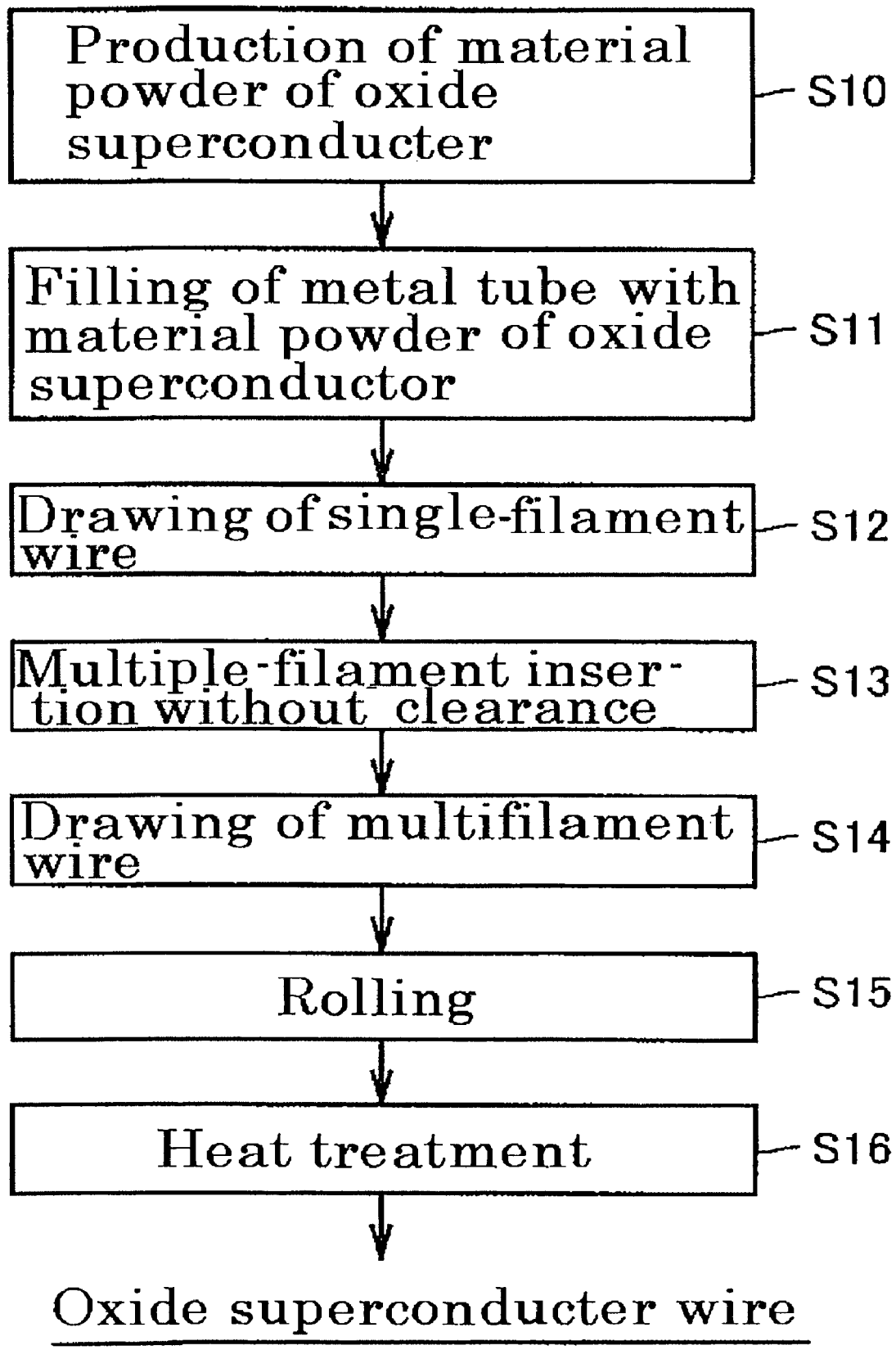
FIG. 5 is a chart showing the production process of an oxide superconducting wire in Embodiment 2 of the present invention.

Next, a method of producing the above-described oxide superconducting wire is explained below. FIG. 5 is a chart showing the production process of an oxide superconducting wire in Embodiment 2 of the present invention.

As shown in FIG. 5, first, the material powder 1 of the oxide superconductor is produced by using the method in Embodiment 1 (Step S10). Next, a metal tube is filled with the material powder 1 (precursor) (Step S11). It is desirable that the metal tube be made of metal such as silver or a silver alloy, which has high thermal conductivity. By employing this structure, the heat produced by a localized quenching phenomenon in the superconductor can be removed promptly from the metal tube.

Subsequently, the wire is processed by drawing until an intended diameter is achieved. Thus, a single-filament wire is produced in which the precursor as the filament material is covered with a metal such as silver (Step S12). A multitude of single-filament wires are bound together and inserted into a metal tube made of a metal such as silver without a clearance (multiple-filament insertion without clearance: Step S13). Thus, a multifilament-structured member is obtained that has a multitude of filament members each having a material powder.

Next, the multifilament-structured member is processed by drawing until an intended diameter is achieved. Thus, a multifilament wire is produced in which a multitude of the material powders 1 are embedded in the sheath portion 3 made of, for example, silver (Step S14). This step produces a multifilament wire having a structure in which the material powder of the oxide superconducting wire is covered with a metal.

The wire is processed by rolling to obtain a tape-shaped wire (Step S15). The rolling operation increases the density of the material powder 1. Then, the tape-shaped wire is heat-treated (Step S16). The heat treatment is performed at a temperature of about 830° C., for example. This heat treatment produces an oxide superconducting phase from the material powder 1. Thus, the oxide superconductor 2 is produced (see FIG. 4). The heat treatment and rolling operation may be performed a plurality of times on the tape-shaped wire.

In this case, the material powder 1 obtained through the production method shown in Embodiment 1 has only a small amount of residues such as carbon. Consequently, when the wire is heat-treated, the residues release only a small amount of gas into the air. As a result, the oxide superconductor 2 reduces the tendency to form voids in the crystal, enabling the increase in the density and purity of the oxide superconductor 2.

Through the above-described production process, the oxide superconducting wire shown in FIG. 4 is obtained.

The method of producing the oxide superconducting wire 4 in this embodiment comprises (a) a step of producing the material powder 1 of the oxide superconductor 2 by using the method of producing the material powder shown in Embodiment 1 (Step S10) and (b) steps of producing the oxide superconducting wire 4 by using the material powder 1 (Steps S11 to S16).

As a result, the density of the oxide superconductor 2 can be increased. An oxide superconducting wire of the present invention can be used, for example, in a superconducting cable, a superconducting transformer, a superconducting fault-current limiter, a power storage apparatus, and other superconducting apparatuses.

Examples of the present invention are explained below.

IMPLEMENTATION EXAMPLE I

In this implementation example, the effect of introducing the cooling gas was studied. More specifically, powders of raw materials of Bi, Pb, Sr, Ca, and Cu were dissolved in a nitric acid solution. The nitrate solution was filtered to remove impurities. The powders of the raw materials were dissolved such that the ratio Bi:Pb:Sr:Ca:Cu became 1.7:0.4:1.9:2.0:3.0. The nitrate solution was mixed with a spraying gas. A solution sprayer was used to form a spray composed of minute liquid drops of several tens of micrometers. The flow rate "q" of the nitrate solution was set to be 20 mL/min. By using a carrier gas, the spray was introduced into an electric furnace heated at a maximum temperature of 800° C. The total flow rate Q1 of the spraying gas and carrier gas was 50 NL/min (NL: a volume at 0° C. and 1 atm). Under these conditions, the drying and pyrolysis of the spray were conducted in an atmosphere (first atmosphere) composed of the spraying gas and carrier gas. Thus, a material powder at high temperature was obtained.

Subsequently, by using the carrier gas, the high-temperature material powder was carried to the outside of the electric furnace. The material powder was cooled in an atmosphere (second atmosphere) having an introduced cooling gas. As the cooling gas, an air was used in which the concentrations of carbon dioxide, nitrogen oxide, and water vapor were controlled. As the spraying gas, carrier gas, and cooling gas, a gas having a water-vapor concentration of 0.01 vol. % was used. The concentration of the carbon dioxide contained in the cooling gas was set to be 10 vol. ppm. In this implementation example, the flow rate (rate of the introduced amount) Q2 of the cooling gas was varied in the range of 0 to 300 NL/min to cool the material powder. In Comparative example 1, the material powder was cooled in an untreated atmosphere containing the removed solvent components without introducing the cooling gas.

Subsequently, by using the carrier gas, the material powder was carried to a powder collector. The powder collector separated the powder from the gas. Thus, the material powder composed of composite metal oxides was collected. Furthermore, the material powder was carried to a heat-treating apparatus to be heat-treated for 10 hours at a temperature of 800° C. in an atmosphere having an oxygen partial pressure of 0.02 MPa. Thus, the material of the oxide superconductor was produced. Each of the operations of the introduction into the heat-treating apparatus, the heating, the cooling, and the taking-out from the heat-treating apparatus was performed in an atmosphere containing at most 1 vol. % of water and at most 30 vol. ppm of carbon dioxide.

Next, the material powder was charged into a silver pipe. The powder was heat-treated for 10 hours at a temperature of 600° C. under a vacuum to remove the gas. The end of the silver pipe was brazed to seal the material powder under a vacuum. Thus, a single-filament wire was produced. With its both ends being sealed, the single-filament wire was processed by drawing. The drawn wire was cut into 55 wires. The 55 wires were bundled together to insert into a silver pipe. The silver pipe with 55 wires was heat-treated for 10 hours at a temperature of 600° C. under a vacuum to remove the gas again. The end of the silver pipe was brazed to seal the material powder under a vacuum. Thus, a multifilament wire was produced. With its both ends being sealed, the multifilament wire was processed by drawing and rolling to obtain a tape-shaped wire having a width of 4 mm and a thickness of 0.2 mm. The tape-shaped wire was heat-treated for 30 hours at a temperature of 820 to 830° C. in an atmosphere having an oxygen partial pressure of 0.008 MPa to produce a Bi2223 phase. Subsequently, after being subjected to an intermediate rolling operation, the wire was further heat-treated for 50 hours at a temperature of 810 to 820° C. in an atmosphere having an oxygen partial pressure of 0.008 MPa to produce an oxide superconducting wire. The critical current value of the obtained oxide superconducting wire was measured in its own magnetic field at 77 K. Table I shows the production conditions of the material powder, such as the flow rate Q2 of the cooling gas, and the critical current value $J_c$ of the obtained oxide superconducting wires.

TABLE I

|  | Comparative example 1 | Example 1 of the present invention | Example 2 of the present invention | Example 3 of the present invention | Example 4 of the present invention |
|---|---|---|---|---|---|
| Flow rate of nitrate solution "q" (mL/min) |  |  | 20 |  |  |
| Total flow rate of spraying gas and carrier gas "Q1" (NL/min) |  |  | 50 |  |  |
| Flow rate of cooling gas "Q2" (NL/min) | 0 | 50 | 100 | 150 | 300 |
| Flow rate of entire gas (Q1 + Q2)/flow rate of nitrate solution (q) | 2,500 | 5,000 | 7,500 | 10,000 | 17,500 |
| Concentration of water contained in each of spraying gas, carrier gas, and cooling gas (vol. %) |  |  | 0.01 |  |  |
| Concentration of carbon dioxide contained in each of spraying gas, carrier gas, and cooling gas (vol. ppm) | — |  | 10 |  |  |
| Concentration of $NO_2$ contained in entire gas (Q1 + Q2) (vol. %) | 3.7 | 2.3 | 1.6 | 1.3 | 0.8 |
| Concentration of $H_2O$ contained in entire gas (Q1 + Q2) (vol. %) | 32 | 20 | 14 | 11 | 7 |
| Dew point of entire gas (Q1 + Q2) (° C.) | 71 | 60 | 53 | 48 | 38 |
| Critical current value $J_c$ (kA/cm$^2$) | 18 | 20 | 22 | 40 | 42 |

In Table I, the term "entire gas (Q1+Q2)" means the atmosphere after the cooling gas was introduced (the atmosphere 16 in FIG. 2 (second atmosphere)). In Comparative example 1, in which the cooling gas was not introduced, the entire gas had an $NO_2$ concentration of 3.7 vol. %, an $H_2O$ concentration of 32 vol. %, and a dew point of 71° C., all of which show high values. The oxide superconducting wire of Comparative example 1 had a critical current value of 18 kA/cm$^2$. On the other hand, in Example 1 of the present invention, in which the cooling gas was introduced at a flow rate of 50 NL/min, the entire gas had an $NO_2$ concentration of 2.3 vol. %, an $H_2O$ concentration of 20 vol. %, and a dew point of 60° C., all of which show lower values than those of Comparative example 1. In addition, the concentration of the carbon dioxide contained in the cooling gas was reduced to 10 vol. ppm. Consequently, it is believed that the concentration of the carbon dioxide contained in the entire gas was also lower than that in the case of Comparative example 1. The critical current value of the oxide superconducting wire of Example 1 of the present invention was 20 kA/cm². The above-described results demonstrate that when the flow rate of the cooling gas is increased to reduce the concentrations of the carbon dioxide, nitrogen oxide, and water vapor contained in the entire gas, the critical current value of an oxide superconducting wire can be increased.

As can be seen from the comparison of the data of Examples 1 to 4 of the present invention, Examples 3 and 4 of the present invention had a critical current value as high as 40 kA/cm² or more. More specifically, in Example 3, the flow rate of the entire gas (Q1+Q2) was 10,000 times the flow rate of the nitrate solution (q). In Example 4, the flow rate of the entire gas (Q1+Q2) was more than 10,000 times the flow rate of the nitrate solution (q) and the concentration of $H_2O$ contained in the entire gas (Q1+Q2) was less than 10 vol. %. The results show that when the volume flow rate of the entire gas formed by adding the spraying gas, carrier gas, and cooling gas is at least 10,000 times the flow rate of the nitrate solution or when the concentration of water vapor in the second atmosphere is at most 10 vol. %, the critical current value can be increased.

IMPLEMENTATION EXAMPLE II

In this implementation example, the relationship between the concentration of carbon dioxide contained in each of the spraying gas, carrier gas, and cooling gas and the critical current value was studied. More specifically, the material of the oxide superconductor was produced through nearly the same method as that of Implementation example I. The material was used to produce oxide superconducting wires. In this case, however, the spraying gas, carrier gas, and cooling gas were introduced by varying their concentrations of carbon dioxide in the range of 1 to 300 vol. ppm. Table II shows the critical current value of the obtained oxide superconducting wires.

TABLE II

|  | Example 5 of the present invention | Example 6 of the present invention | Example 7 of the present invention | Example 8 of the present invention |
|---|---|---|---|---|
| Flow rate of nitrate solution "q" (mL/min) | | | 20 | |
| Total flow rate of spraying gas and carrier gas "Q1" (NL/min) | | | 50 | |
| Flow rate of cooling gas "Q2" (NL/min) | | | 300 | |
| Concentration of carbon dioxide contained in each of spraying gas, carrier gas, and cooling gas (vol. ppm) | 300 | 30 | 10 | 1 |
| Critical current value $J_c$ (kA/cm²) | 29 | 40 | 42 | 43 |

As can be seen from Table II, Examples 6 to 8 of the present invention had a critical current value as high as 40 kA/cm² or more. More specifically, in these examples, the concentration of carbon dioxide contained in each of the spraying gas, carrier gas, and cooling gas was 30 vol. ppm or less. The results show that when the concentration of carbon dioxide contained in each of the spraying gas, carrier gas, and cooling gas is at most 30 vol. ppm, the critical current value can be increased.

IMPLEMENTATION EXAMPLE III

In this implementation example, the effect of the concentration of water vapor contained in each of the spraying gas, carrier gas, and cooling gas and the atmosphere in the heat-treating apparatus on the critical current value was studied. More specifically, the material of the oxide superconductor was produced through nearly the same method as that of Implementation example I. The material was used to produce oxide superconducting wires. In this case, however, the spraying gas, carrier gas, and cooling gas were introduced by varying their concentrations of water vapor in the range of 0.0004 to 2 vol. %. In addition, the material powder was heat treated by varying the concentration of water vapor in the heat-treating apparatus in the range of 1 to 4 vol. % and the concentration of carbon dioxide in the heat-treating apparatus in the range of 30 to 300 vol. ppm. Table III shows the critical current value of the obtained oxide superconducting wires.

TABLE III

|  | Example 9 of the present invention | Example 10 of the present invention | Example 11 of the present invention | Example 12 of the present invention | Example 13 of the present invention | Example 14 of the present invention | Example 15 of the present invention |
|---|---|---|---|---|---|---|---|
| Flow rate of nitrate solution "q" (mL/min) | | | | 20 | | | |
| Total flow rate of spraying gas and carrier gas "Q1" (NL/min) | | | | 50 | | | |
| Flow rate of cooling gas "Q2" (NL/min) | | | | 300 | | | |
| Concentration of water contained in each of spraying gas, carrier gas, and cooling gas (vol. %) | 2 | 1 | 0.4 | 0.01 | 0.0004 | 0.0004 | 0.0004 |
| Concentration of $H_2O$ contained in entire gas (Q1 + Q2) (vol. %) | 8.4 | 7.6 | 6.9 | 6.6 | 6.6 | 6.6 | 6.6 |
| Dew point of entire gas (Q1 + Q2) (° C.) | 42 | 40 | 39 | 38 | 38 | 38 | 38 |
| Concentration of $H_2O$ contained in heat-treating apparatus (vol. %) | 1 | 1 | 1 | 1 | 1 | 4 | 1 |
| Concentration of $CO_2$ contained in heat-treating apparatus (vol. ppm) | 30 | 30 | 30 | 30 | 30 | 30 | 300 |
| Critical current value $J_c$ (kA/cm²) | 29 | 39 | 40 | 42 | 43 | 29 | 32 |

As can be seen from Table III, Examples 10 to 13 of the present invention had a critical current value as high as 39 kA/cm² or more. More specifically, in these examples, the concentration of water vapor contained in each of the spraying gas, carrier gas, and cooling gas was 1 vol. % or less; the concentrations of water vapor in the heat-treating apparatus was 1 vol. %; and the concentrations of carbon dioxide in the heat-treating apparatus was 30 vol. ppm. The results show that when the concentration of water vapor contained in each of the spraying gas, carrier gas, and cooling gas is at most 1 vol. %, the critical current value can be increased.

IMPLEMENTATION EXAMPLE IV

Figure 6:
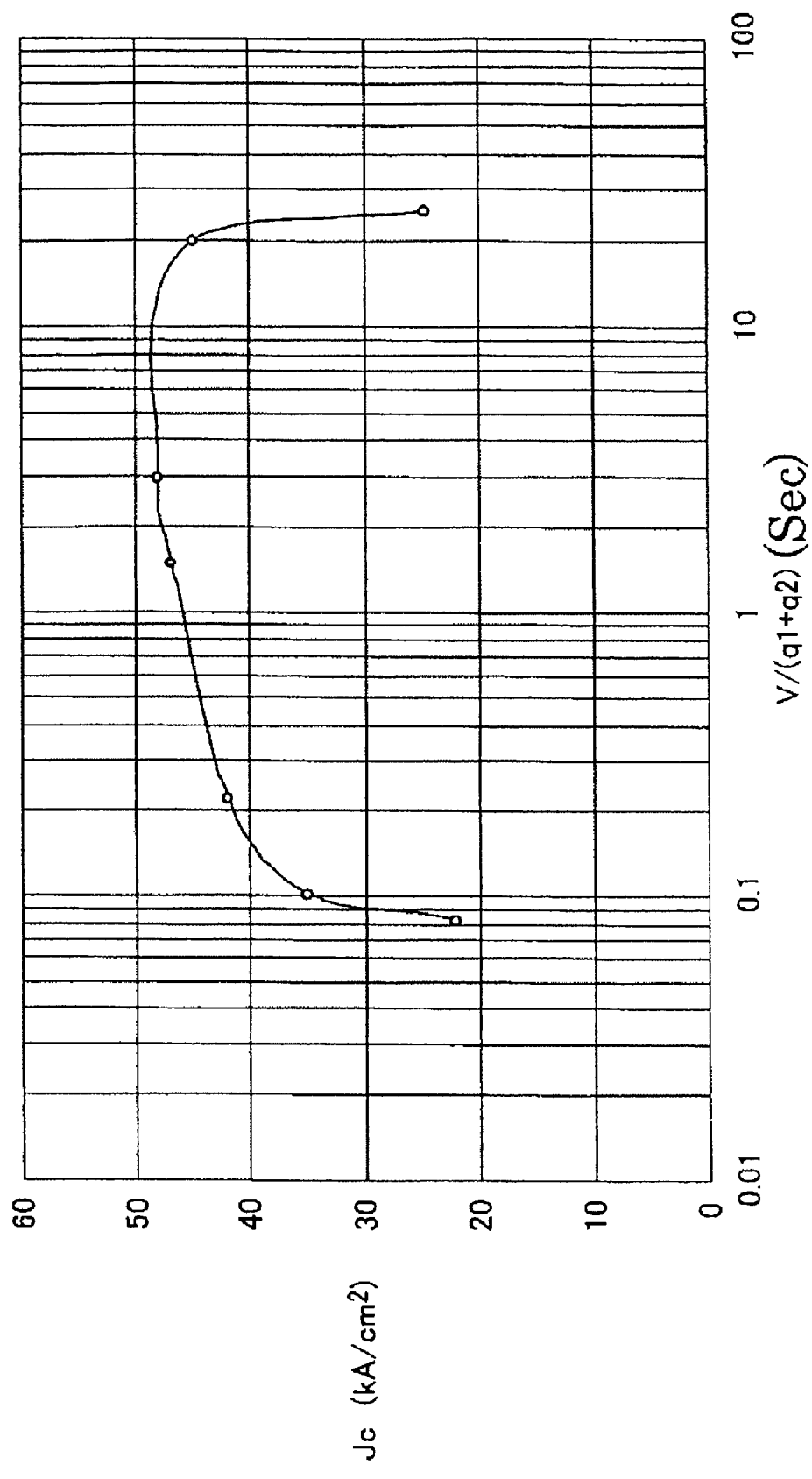
FIG. 6 is a graph showing the critical current value of the oxide superconducting wires in Implementation example IV.

In this implementation example, the relationship between the volume of the first atmosphere and the critical current value was studied. More specifically, the material of the oxide superconductor was produced through nearly the same method as that of Implementation example I. The material was used to produce oxide superconducting wires. In this case, however, the volume of the first atmosphere was set to be 100 (liter), and the total of the volume flow rate of the gas in the first atmosphere and the volume flow rate of the gas generated from the solution was varied in the range of 3.3 to 1,199 (liter/sec). Table IV and FIG. 6 show the critical current value of the obtained oxide superconducting wires.

contains bismuth, lead, strontium, calcium, and copper but also contains a Bi2223 phase, which approximately expresses the ratios of the atoms of bismuth and lead to strontium to calcium to copper as 2:2:2:3, and to a method of producing an oxide superconducting wire by using the material.

The invention claimed is
1. A method of producing a material of an oxide superconductor, the method comprising the steps of:
(a) in a solution, ionizing a material containing an atom for constituting the oxide superconductor;
(b) by removing a solvent by spraying the solution in a first atmosphere, producing a powder containing the atom for constituting the oxide superconductor; and
(c) cooling the powder in a second atmosphere into which a cooling gas is introduced;
the concentration of carbon dioxide in the second atmosphere being lower than that in the first atmosphere, which contains the removed solvent component;
the concentration of nitrogen oxide in the second atmosphere being lower than that in the first atmosphere, which contains the removed solvent component;
the concentration of water vapor in the second atmosphere being lower than that in the first atmosphere, which contains the removed solvent component.

TABLE IV

|  | Example 16 of the present invention | Example 17 of the present invention | Example 18 of the present invention | Example 19 of the present invention | Example 20 of the present invention | Example 21 of the present invention | Example 22 of the present invention |
| --- | --- | --- | --- | --- | --- | --- | --- |
| $q_1 + q_2$ (liter/sec) | 3.9 | 5.0 | 33.4 | 66.8 | 448 | 983 | 1,199 |
| V (liter) | 100 | 100 | 100 | 100 | 100 | 100 | 100 |
| $V/(q_1 + q_2)$ (sec) | 26 | 20 | 3.0 | 1.5 | 0.22 | 0.10 | 0.08 |
| Critical current value $J_c$ (kA/cm²) | 25 | 45 | 48 | 47 | 42 | 35 | 22 |

As can be seen from Table IV and FIG. 6, Examples 17 to 21 of the present invention had a critical current value as high as 35 kA/cm² or more. More specifically, in these examples, the value $V/(q_1+q_2)$ satisfied the condition of at least 0.1 (sec) and at most 20 (sec). The results show that when the volume of the first atmosphere satisfies the relationship 0.1 (sec)$\leq V/(q_1+q_2)\leq$20 (sec), the critical current value can be increased.

It is to be considered that the above-disclosed embodiments and examples are illustrative and not restrictive in all respects. The scope of the present invention is shown by the scope of the appended claims, not by the above-described embodiments and examples. Accordingly, the present invention is intended to cover all revisions and modifications included within the meaning and scope equivalent to the scope of the claims.

INDUSTRIAL APPLICABILITY

It is desirable that the present invention's method of producing a material of an oxide superconductor and the present invention's method of producing an oxide superconducting wire be applied to a method of producing a material of a bismuth-based oxide superconductor and to a method of producing a bismuth-based oxide superconducting wire, and in particular, to a method of producing a material of a Bi—Pb—Sr—Ca—Cu—O-based oxide superconductor that not only 2. A method of producing a material of an oxide superconductor as defined by claim 1, wherein the step of producing a powder (b) comprises the steps of:
(b1) spraying the solution together with a spraying gas; and
(b2) carrying the solution from the first atmosphere to the second atmosphere by using a carrier gas;
wherein the volume flow rate of the entire gas formed by adding the spraying gas, the carrier gas, and the cooling gas being at least 10,000 times that of the solution.

3. A method of producing a material of an oxide superconductor as defined by claim 1, wherein the step of producing a powder (b) comprises the steps of:
(b1) spraying the solution together with a spraying gas; and
(b2) carrying the solution from the first atmosphere to the second atmosphere by using a carrier gas;
wherein the concentration of the water vapor in the second atmosphere being at most 10 vol. %.

4. A method of producing a material of an oxide superconductor as defined by claim 1, wherein the step of producing a powder (b) comprises the steps of:
(b1) spraying the solution together with a spraying gas; and
(b2) carrying the solution from the first atmosphere to the second atmosphere by using a carrier gas;
wherein the relationship 0.1 (sec)$\leq V/(q_1+q_2)\leq$20 (sec) being satisfied, where $q_1$ (liter/sec) is the volume flow rate of the first atmosphere's gas formed by adding the spraying gas and the carrier gas, $q_2$ (liter/sec) is the volume flow rate of the gas generated from the solution, and V (liter) is the volume of the first atmosphere.

5. A method of producing a material of an oxide superconductor as defined by claim 1, wherein the step of producing a powder (b) comprises the steps of:
   (b1) spraying the solution together with a spraying gas; and
   (b2) carrying the solution from the first atmosphere to the second atmosphere by using a carrier gas;
   wherein each of the spraying gas, the carrier gas, and the cooling gas having a water-vapor concentration of at most 1 vol. %.

6. A method of producing a material of an oxide superconductor as defined by claim 1, wherein the step of producing a powder (b) comprises the steps of:
   (b1) spraying the solution together with a spraying gas; and
   (b2) carrying the solution from the first atmosphere to the second atmosphere by using a carrier gas;
   wherein each of the spraying gas, the carrier gas, and the cooling gas having a carbon dioxide concentration of at most 30 vol. ppm.

7. A method of producing a material of an oxide superconductor as defined by claim 1, the method further comprising a step of heat-treating the powder after the step of cooling the powder.

8. A method of producing a material of an oxide superconductor as defined by claim 7, wherein:
   (a) a step is further provided in which the powder is cooled immediately after the heat treatment of it;
   (b) both the step of heat-treating the powder and the step of cooling the powder immediately after the heat treatment of it are carried out in a heat-treating apparatus; and
   (c) the concentration of water vapor is at most 1 vol. % in each of the following atmospheres:
   (c1) the atmosphere in the heat-treating apparatus at the time of the introduction of the powder into the heat-treating apparatus;
   (c2) the atmosphere in the heat-treating apparatus at the time of the heat treatment of the powder;
   (c3) the atmosphere in the heat-treating apparatus at the time of the cooling of the powder; and
   (c4) the atmosphere in the heat-treating apparatus at the time of the taking out of the powder from the heat-treating apparatus.

9. A method of producing a material of an oxide superconductor as defined by claim 7, wherein:
   (a) a step is further provided in which the powder is cooled immediately after the heat treatment of it;
   (b) both the step of heat-treating the powder and the step of cooling the powder immediately after the heat treatment of it are carried out in a heat-treating apparatus; and
   (c) the concentration of carbon dioxide is at most 30 vol. ppm in each of the following atmospheres:
   (c1) the atmosphere in the heat-treating apparatus at the time of the introduction of the powder into the heat-treating apparatus;
   (c2) the atmosphere in the heat-treating apparatus at the time of the heat treatment of the powder;
   (c3) the atmosphere in the heat-treating apparatus at the time of the cooling of the powder; and
   (c4) the atmosphere in the heat-treating apparatus at the time of the taking out of the powder from the heat-treating apparatus.

10. A method of producing a material of an oxide superconductor as defined by claim 1, wherein the solution is a nitric acid solution.

11. A method of producing an oxide superconducting wire, the method comprising the steps of:
    (a) producing a material of an oxide superconductor by using a method of producing a material of an oxide superconductor, comprising the steps of:
    (a1) in a solution, ionizing a material containing an atom for constituting the oxide superconductor;
    (a2) by removing a solvent by spraying the solution in a first atmosphere, producing a powder containing the atom for constituting the oxide superconductor; and
    (a3) cooling the powder in a second atmosphere into which a cooling gas is introduced;
    the concentration of carbon dioxide in the second atmosphere being lower than that in the first atmosphere, which contains the removed solvent component;
    the concentration of nitrogen oxide in the second atmosphere being lower than that in the first atmosphere, which contains the removed solvent component;
    the concentration of water vapor in the second atmosphere being lower than that in the first atmosphere, which contains the removed solvent component; and
    (b) producing an oxide superconducting wire by using the material of the oxide superconductor.

* * * * *